(12) United States Patent
Xu et al.

(10) Patent No.: US 12,157,943 B2
(45) Date of Patent: Dec. 3, 2024

(54) METHODS OF SELECTIVE DEPOSITION

(71) Applicant: Applied Materials, Inc., Santa Clara, CA (US)

(72) Inventors: Wenjing Xu, San Jose, CA (US); Gang Shen, San Jose, CA (US); Yufei Hu, Fremont, CA (US); Feng Chen, San Jose, CA (US); Tae Hong Ha, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 530 days.

(21) Appl. No.: 17/011,667

(22) Filed: Sep. 3, 2020

(65) Prior Publication Data

US 2022/0064784 A1   Mar. 3, 2022

(51) Int. Cl.
*H01L 21/02* (2006.01)
*C23C 16/02* (2006.01)
*C23C 16/18* (2006.01)
*H01L 21/285* (2006.01)

(52) U.S. Cl.
CPC .......... *C23C 16/18* (2013.01); *C23C 16/0227* (2013.01); *H01L 21/02068* (2013.01); *H01L 21/28568* (2013.01)

(58) Field of Classification Search
None
See application file for complete search history.

(56) References Cited

U.S. PATENT DOCUMENTS

| | | | |
|---|---|---|---|
| 2016/0056112 A1* | 2/2016 | Edelstein | H01L 21/7685 257/751 |
| 2016/0133563 A1* | 5/2016 | Ai | H01L 21/76826 438/628 |
| 2018/0012752 A1 | 1/2018 | Tapily et al. | |
| 2018/0082956 A1* | 3/2018 | Edelstein | H01L 21/76846 |
| 2018/0096888 A1* | 4/2018 | Naik | H01L 21/76883 |
| 2019/0185993 A1 | 6/2019 | Chen et al. | |
| 2019/0198318 A1* | 6/2019 | Bhuyan | H01L 21/02068 |
| 2019/0368034 A1 | 12/2019 | Liu et al. | |
| 2020/0105515 A1 | 4/2020 | Maes et al. | |
| 2020/0168453 A1* | 5/2020 | Saly | H01L 21/76879 |

FOREIGN PATENT DOCUMENTS

| | | | | |
|---|---|---|---|---|
| JP | 2008532258 A | 8/2008 | | |
| JP | 2014187307 A | 10/2014 | | |
| JP | 2017222928 A | 12/2017 | | |
| WO | WO-2019036188 A1 * | 2/2019 | | H01L 21/0228 |

OTHER PUBLICATIONS

PCT International Search Report and Written Opinion in PCT/US2021/042550 dated Nov. 11, 2021, 10 pages.

* cited by examiner

*Primary Examiner* — Hrayr A Sayadian
(74) *Attorney, Agent, or Firm* — Servilla Whitney LLC

(57) ABSTRACT

Methods for selective deposition are described herein. Further, methods for improving selectivity comprising an ammonia plasma pre-clean process are also described. In some embodiments, a silyl amine is used to selectively form a surfactant layer on a dielectric surface. A ruthenium film may then be selectively deposited on a conductive surface. In some embodiments, the ammonia plasma removes oxide contaminations from conductive surfaces without adversely affecting the dielectric surface.

13 Claims, 3 Drawing Sheets ial to a silyl amine of the general formula $((CH_3)_2N)_xSi(CH_3)_y((CH_2)_zCH_3)$, where x is 1-3, y is 0-2, x+y equals 3, and z is 0-17 to selectively form a surfactant layer on the dielectric material. A film is selectively deposited on the conductive material.

METHODS OF SELECTIVE DEPOSITION

TECHNICAL FIELD

Embodiments of the disclosure generally relate to methods of selective deposition of a film on a conductive or metal surface. Some embodiments of the disclosure are directed to methods of selective deposition which utilize silyl amines to form self-assembled monolayers (SAMs). Some embodiments of the disclosure are directed to methods of selective deposition comprising a pre-clean process with an ammonia plasma.

BACKGROUND

The semiconductor industry faces many challenges in the pursuit of device miniaturization including the rapid scaling of nanoscale features. Such challenges include the fabrication of complex devices, often using multiple lithography steps and etch processes. Furthermore, the semiconductor industry needs low cost alternatives to high cost EUV for patterning complex architectures. To maintain the cadence of device miniaturization and keep chip manufacturing costs down, selective deposition has shown promise. It has the potential to remove costly lithographic steps by simplifying integration schemes.

Selective deposition of materials can be accomplished in a variety of ways. For instance, some processes may have inherent selectivity to surfaces based on their surface chemistry. These processes are rare, and typically specific to the reactants used, materials formed and the substrate surfaces.

Self-Assembled Monolayer (SAM) is an approach to enable selective deposition on multiple material surfaces. Ideally, during the SAM passivation, a SAM forms over all dielectric surfaces perfectly, and block 100% of film deposition from subsequent deposition steps so that the film only grows on conductor/metal surface.

However, the SAM grows in an asymptotic thickness as a function of deposition time and number of cycles so that achieving an ideal SAM that provides 100% blocking for the film is extremely difficult.

Further, most SAM precursors comprise long-hydrophobic carbon chains to prevent deposition. The chains increase the hydrophobicity of the surface on which the SAM is deposited, but may also decrease vapor pressure making the precursor more difficult to deliver into the processing chamber.

Accordingly, there is a need for new SAM precursors which provide good selectivity and have relatively high vapor pressure.

The selectivity of SAM-based selective deposition processes also typically depends on the condition of the substrate surfaces before SAM deposition. For example, on a substrate which contains a metal surface to be deposited on, it may be necessary to remove any native metal oxides before forming the SAM and/or depositing the film. Conventionally, oxides are removed from metal surfaces by a hydrogen plasma treatment. But treatment of a substrate containing a dielectric surface with hydrogen plasma may damage the dielectric material.

Accordingly, there is a need for new substrate treatment processes which increase selectivity without damaging dielectric materials.

SUMMARY

One or more embodiments of the disclosure are directed to a method of selective deposition. The method comprises exposing a substrate comprising a conductive material and a dielectric material to a silyl amine of the general formula $((CH_3)_2N)_xSi(CH_3)_y((CH_2)_zCH_3)$, where x is 1-3, y is 0-2, x+y equals 3, and z is 0-17 to selectively form a surfactant layer on the dielectric material. A film is selectively deposited on the conductive material.

Additional embodiments of the disclosure are directed to a method of improving selectivity. The method comprises exposing a substrate comprising a conductive material with oxide contaminants and a dielectric material with —OH surface terminations to a plasma formed from a nitrogen-containing gas to remove the oxide contaminants and form —NH surface terminations on the dielectric material.

Further embodiments of the disclosure are directed to a method of selective deposition. The method comprises exposing a substrate comprising a conductive material with oxide contaminants and a dielectric material with —OH surface terminations to a plasma formed from a nitrogen-containing gas to remove the oxide contaminants and form —NH surface terminations on the dielectric material. The substrate is exposed to a silyl amine of the general formula $(N(CH_3)_2)_xSi(CH_3)_y((CH_2)_zCH_3)$, where x is 1-3, y is 0-2, x+y equals 3, and z is 0-5 to selectively form a surfactant layer on the dielectric material. A film is selectively deposited on the conductive material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
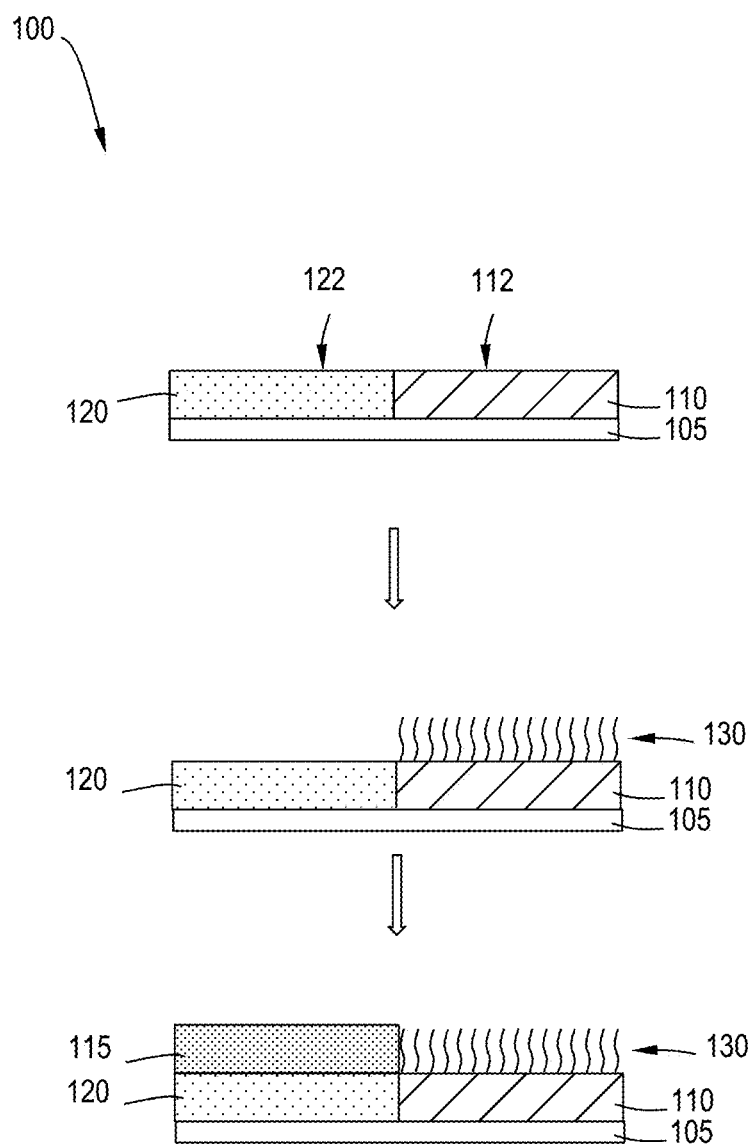
FIG. 1 illustrates an exemplary substrate during processing according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

Further, a "substrate" as used herein, refers to any substrate or material surface formed on a substrate upon which film processing is performed during a fabrication process.

For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers.

Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used herein, a "patterned substrate" refers to a substrate with a plurality of different material surfaces. In some embodiments, a patterned substrate comprises a first surface and a second surface. In some embodiments, the first surface comprises a dielectric material and the second surface comprises a conductive material. In some embodiments, the first surface comprises a conductive material and the second surface comprises a dielectric material.

As used in this specification and the appended claims, the terms "reactive gas", "process gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Some embodiments of the disclosure provide methods of selective deposition which utilize silyl amine based SAMs. Some embodiments of the disclosure provide methods and apparatuses for enhancing the effective selectivity of SAM-based selective depositions.

As used in this specification and the appended claims, the term "selectively depositing on a first surface over a second surface", and the like, means that a first amount of a film or layer is deposited on the first surface and a second amount of film or layer is deposited on the second surface, where the second amount of film is less than the first amount of film, or no film is deposited on the second surface. The term "over" used in this regard does not imply a physical orientation of one surface on top of another surface but rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

In some embodiments, "selectively" means that the subject material forms on the target surface at a rate greater than or equal to about 10×, 15×, 20×, 25×, 30×, 35×, 40×, 45× or 50× the rate of formation on the non-selected surface. Stated differently, the selectivity for the target material surface relative to the non-selected surface is greater than or equal to about 10:1, 15:1, 20:1, 25:1, 30:1, 35:1, 40:1, 45:1 or 50:1.

One strategy to achieve selective deposition employs the use of blocking layers in which a blocking layer is formed on substrate materials upon which deposition is to be avoided with negligible impact to the target substrate material. A film can be deposited on the target substrate material while deposition on other substrate materials is "blocked" by the blocking layer. The blocking layer can be optionally removed without net adverse effects to the deposited film.

Some embodiments of the disclosure incorporate a blocking layer typically referred to as a self-assembled monolayer (SAM) or SAM layer. A self-assembled monolayer (SAM) consists of an ordered arrangement of spontaneously assembled organic molecules (SAM molecules) adsorbed on a surface. These molecules are typically comprised of one or more moieties with an affinity for the substrate (head group) and a relatively long, inert, linear hydrocarbon moiety (tail group). SAM molecules are fundamentally a surfactant which has a hydrophilic functional head with a hydrophobic carbon chain tail.

SAM formation happens through fast adsorption of molecular head groups at the surface and slow association of molecular tail groups with each other through van der Waals interactions. SAM precursors are chosen such that the head group selectively reacts with the substrate materials to be blocked during deposition. Deposition is then performed, and in some embodiments, the SAMs can be removed, for example through a thermal decomposition (with desorption of any byproducts) or an integration-compatible ashing process.

A representative process flow for selective deposition may include a) providing a patterned substrate, b) growing a SAM (either by CVD, ALD, or immersion), and c) selective deposition (e.g. CVD or ALD) of a film. In the representative process flow, the SAM is used as a sacrificial layer to enable selective deposition.

Fundamentally the SAM growth on a surface is a chemisorption process. Determined by chemisorption kinetics, the coverage of a SAM layer follows the Elovich equation $$\frac{d_q}{d_\tau} = \alpha \exp(-\beta q)$$

where q is the amount of chemisorption, t is time, $\alpha$ is the initial rate of chemisorption (mmol/g-min) and $\beta$ is the desorption constant (g/mmol). Accordingly the coverage of a SAM layer as the function of time follows an asymptotic trend. As a result, the selectivity of SAM-based depositions follows a similar trend as well (i.e. as coverage increases, selectivity also increases).

Referring to FIG. 1, one or more embodiment of the disclosure is directed to a processing method 100. A substrate 105 is provided with a first material 110 and a second material 120. The first material 110 has a first surface 112 and the second material 120 has a second surface 122. The first surface 112 is on a first material 110 and the second surface 122 is on a second material 120 different from the first material 110.

In some embodiments, the first material 110 comprises a dielectric material and the second material 120 comprises a conductive material. In some embodiments, the dielectric material comprises one or more of silicon oxide, silicon nitride, silicon carbide, low-k dielectrics and combinations thereof. In some embodiments, the conductive material comprises one or more of copper, manganese, cobalt, tungsten, ruthenium, or molybdenum. In some embodiments, first surface comprises a dielectric material consisting essentially of silicon oxide and the second surface comprises a conductive material consisting essentially of copper. As used in this specification and the appended claims, the term "consists essentially of" means that greater than or equal to about 95%, 98% or 99% of the specified material is the stated material.

The substrate 105 (including the first surface 112 and the second surface 122) is exposed to a SAM precursor to selectively form a SAM layer 130 on the first material 110 (or first surface 112) over the second material (or second surface 122).

The substrate may be exposed to the SAM precursor by any suitable process. In some embodiments, the substrate is exposed to the SAM precursor by a chemical vapor deposition (CVD) process. In some embodiments, the substrate is exposed to the SAM precursor by an ALD process. In some embodiments, the substrate is exposed to the SAM precursor by an immersion or "wet" process.

The SAM precursor may be any compound capable of selectively forming a SAM layer on the first surface 112 over the second surface 122. In general, the SAM precursor comprises at least one blocking molecule. Throughout this disclosure and the appended claims, the terms blocking molecule and surfactant are used interchangeably. Similarly, the terms "SAM layer" and "surfactant layer" are also used interchangeably.

A blocking molecule has the general formula A-L, where A is a reactive head group and L is a tail group. In some embodiments, a reactive group can be included at the end of the tail group opposite the head group.

As used in this manner, the "head group" is any chemical moiety that associates with the first surface 112 and the "tail group" is any chemical moiety that extends away from the first surface 112.

In some embodiments, A is $(R_2N)_x R'_y Si$—, where each R and R' is independently selected from C1-C6 alkyl, C1-C6 cycloakyl and C1-C6 aryl, x is 1-3 and y is 0-2. In some embodiments, x+y equals 3.

Some of the reactive head groups comprise more than one reactive moiety in a single reactive head group (e.g. $((R_2N)_3Si$— may bond up to three times with the surface) which is attached to tail group, L. In some embodiments, A comprises a reactive group connected to more than one tail group L. In these embodiments, each of the tail groups may be the same or different.

In some embodiments, L is —$(CH_2)_n CH_3$ and n is 0-17. In some embodiments, L is —$(CH_2)_n$— and n is an integer from 0 to 18 and a reactive group is on the end of the tail group opposite the head group. In some embodiments, the tail group may be branched. In some embodiments, the tail group may be substituted. In some embodiments, the tail group may be unsaturated. In some embodiments, the tail group may comprise cycloalkyl or aryl groups.

In some embodiments, the tail groups associate with each other through relatively slow van der Waals interaction. In some embodiments, the tail groups can be the same or different so that a homogeneous or heterogeneous SAM can be formed. In some embodiments, the SAM precursor comprises at least two different blocking molecules so that a heterogeneous SAM is formed.

In some embodiments, the blocking compound is a silyl amine. In some embodiments, the blocking compound has a general formula of $((CH_3)_2N)_x Si(CH_3)_y((CH_2)_z CH_3)$, where x is 1-3, y is 0-2, x+y equals 3, and z is 0-17. In some embodiments, z is less than or equal to 5. In some embodiments, z is 0.

The SAM precursor can be delivered to the substrate as a single compound or sequential exposures of multiple compounds to form the SAM layer 130. In some embodiments, the first surface 112 is exposed to a single compound that assembles on the surface in an ordered or semi-ordered manner.

After formation of the SAM layer 130, a film 115 is deposited on the second surface 122. The amount of the film 115 formed on the first surface 112 is less than the amount of the film formed on the second surface 122. A measurement of the amount of film 115 formed on the surfaces can be the average thickness of the film formed on each surface. In some embodiments, the film 115 has a first average thickness on the first surface 112 and a second average thickness on the second surface 122. Described differently, the deposition of the film 115 may be described as selectively depositing a film 115 on the second surface 122 over the first surface 112. While the film 115 depicted in FIG. 1 is not shown on the first surface 112, those skilled in the art will understand that a small amount of deposition may occur.

In some embodiments, the film 115 comprises a metal film. In some embodiments, the film comprises or consists essentially of ruthenium. In some embodiments, after depositing a film 115 consisting essentially of ruthenium, a cobalt film is deposited on the film 115 to form a Ru—Co capping layer on the second material 120.

The film 115 may be deposited by any suitable process. In some embodiments, the film 115 is deposited by CVD. In some embodiments, the film 115 is deposited by ALD. In some embodiments, the film 115 is deposited by exposing the substrate to a plurality of reactants. In some embodiments, the plurality of reactants is exposed to the substrate separately. In some embodiments, the plurality of reactants is separated temporally. In some embodiments, the plurality of reactants is separated spatially.

Some embodiments of the disclosure provide methods for improving the selectivity of a selective deposition process. Some embodiments of the disclosure advantageously provide methods for removing oxide contaminants from the conductive material. Without being bound by theory, it is believed that selective deposition of the blocking compound relies on the differing surface terminations between the first material 110 and the second material 120. Further, removal of oxide contaminants from the conductive surface increases the —H terminations on the conductive material.

Yet typical cleaning methods for removing oxide contaminants ($H_2$ plasma) can also damage the —OH terminations of the dielectric material. Some embodiments of the disclosure advantageously remove oxide contaminants without decreasing —OH terminations of the dielectric material.

Figure 2:
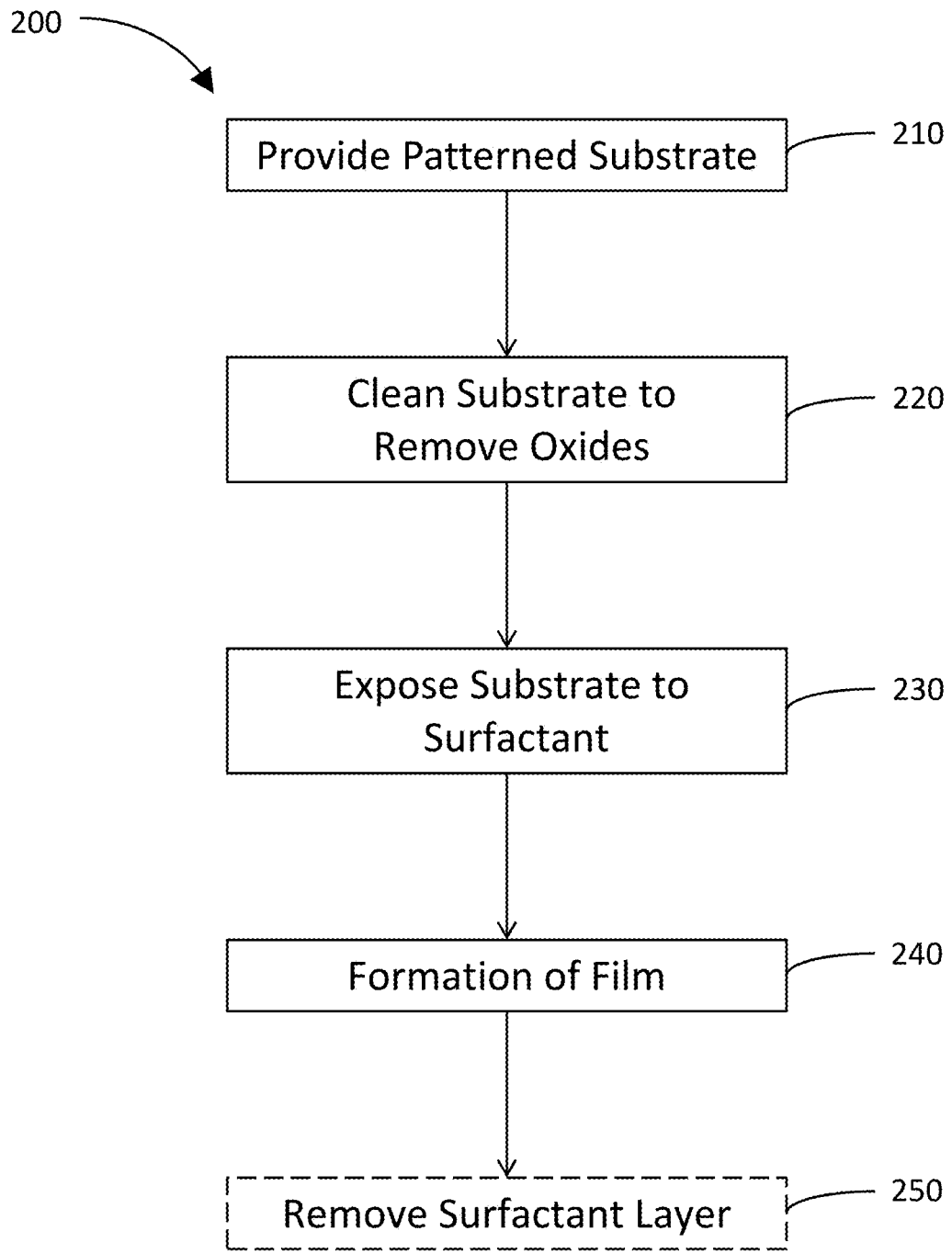
FIG. 2 illustrates an exemplary processing method according to one or more embodiment of the disclosure.

Referring to FIG. 2, a cleaning method 200 for improving selectivity is described. The method 200 begins at operation 210 by providing a patterned substrate. In some embodiments, the patterned substrate may be the substrate 105 described above. The patterned substrate comprises a conductive material and a dielectric material. The conductive material has oxide contaminants thereon. The dielectric material has —OH surface terminations.

In some embodiments, the conductive material comprises copper and the oxide contaminants comprise CuO. In some embodiments, the dielectric material comprises $SiO_2$ with —OH surface terminations.

At operation 220, the patterned substrate is exposed to a plasma formed from a nitrogen-containing gas to remove the oxide contaminants and form —NH surface terminations on the dielectric material. In some embodiments, all or nearly all of the surface terminations on the dielectric material are converted from —OH terminations to —NH terminations. In some embodiments, greater than 10%, greater than 25%, greater than 50% greater than 80% or greater than 90% of the —OH surface terminations are converted to —NH terminations.

Without being bound by theory, it is believed that the conversion of —OH terminations to —NH terminations has little to no effect on the selectivity of the blocking compound for the first surface over the second surface. In contrast, traditional oxide removal processes which rely on hydrogen-based plasmas convert at least some of the —OH terminations to —H terminations thereby adversely affecting the selectivity of the blocking compound and the later deposited film.

The nitrogen-containing gas can be any suitable gas which removes oxide contaminants from the conductive material surface. In some embodiments, the nitrogen-containing gas comprises one or more of ammonia, diimide or nitrogen gas ($N_2$). In some embodiments, the nitrogen-containing gas consists essentially of ammonia ($NH_3$). As used in this regard, a process gas which consists essentially of a stated gas comprises greater than or equal to 95%, greater than or equal to 98%, greater than or equal to 99%, greater than or equal to 99.5% of the stated gas on a molar basis, excluding any inert diluent or carrier gasses.

The plasma may be generated by any suitable means, including but not limited to, remote plasma and direct plasma. The plasma may be an inductively coupled plasma (ICP) or conductively coupled plasma (CCP). The plasma has a power in a range of 200 W to 1000 W, in a range of 300 W to 800 W, in a range of 400 W to 600 W, or in a range of 450 W to 550 W.

The substrate may be exposed to the plasma for any period of time sufficient to remove the oxide contaminants from the conductive surface. In some embodiments, the substrate is cleaned by the plasma for a period in a range of 0.5 seconds to 30 seconds, in a range of 1 second to 10 seconds, or in a range of 2 seconds to 5 seconds.

In some embodiments, the method 200 continues at operation 230 by exposing the substrate to a blocking compound. The blocking compound may be any suitable compound for selectively forming a SAM layer on one of the materials of the substrate. In some embodiments, the blocking compound selectively forms a SAM layer on the dielectric material over the conductive material. In some embodiments, the blocking compound is a silyl amine as described above. In some embodiments, the blocking compound selectively forms a SAM layer on the conductive material over the dielectric material.

After formation of the SAM layer, at operation 240 a film may be selectively deposited on the unblocked material surface. The film may be deposited by any suitable means including, but not limited to, CVD or ALD. In some embodiments, the film comprises ruthenium.

As described above, the plasma formed from the nitrogen-containing gas improves the selectivity of the deposited film. In some embodiments, the selectivity improvement is evident relative to an uncleaned substrate. In some embodiments, the selectivity of the film is increased by greater than or equal to 5%, greater than or equal to 10%, greater than or equal to 20%, or greater than or equal to 25% relative to a similar process without cleaning the substrate.

In some embodiments, the selectivity improvement is evident relative to process which utilizes hydrogen plasma to clean the substrate. In some embodiments, the deposition rate of the film on a substrate cleaned with the nitrogen-containing plasma is at least 5% greater, at least 10% greater, at least 20% greater, at least 30% greater, at least 40% greater or at least 50% greater than the deposition rate on a substrate cleaned with hydrogen plasma.

At optional operation 250, the surfactant later may be removed. In some embodiments, the surfactant layer is removed by exposure to a plasma or an ashing process. Some embodiments of the disclosure advantageously provide surfactant layers which do not adversely affect the conductivity or resistance of the resulting devices. Accordingly, in some embodiments, the surfactant layer is not removed.

EXAMPLE

Two patterned substrates with alternating lines of copper and silicon oxide were provided for processing. A first substrate was cleaned by a hydrogen plasma. The second substrate was cleaned with an ammonia plasma. Both substrates were exposed to a 400 W plasma at 3 Torr for 10 seconds. Both substrates were exposed to Dodecyl-dimethyl (dimethylamino)silane. Both substrates were exposed to triruthenium dodecycarbonyl and hydrogen gas at 175° C. and 5 Torr to selectively deposit ruthenium on the copper lines.

Figure 3A:
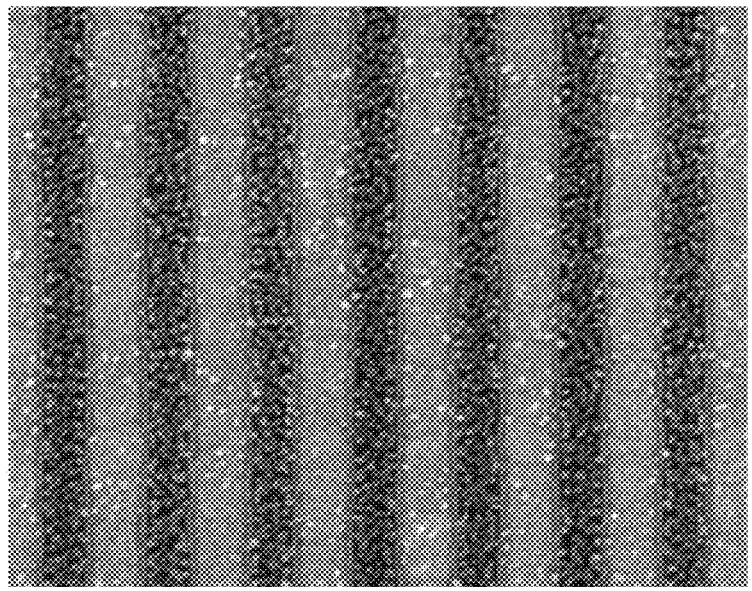
FIG. 3A illustrates a patterned substrate after processing according to a process comprising a hydrogen plasma pre-clean.
Figure 3B:
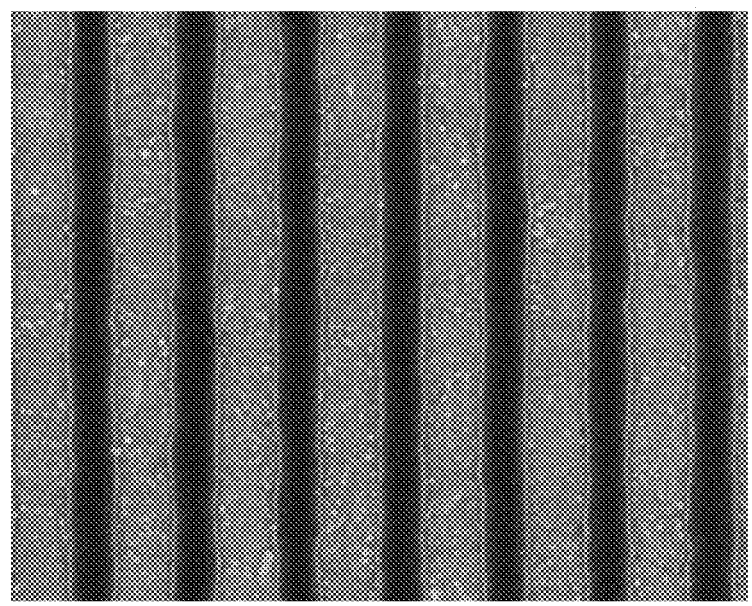
FIG. 3B illustrates a patterned substrate after processing according to one or more embodiment of the disclosure.

SEM Images of the resulting substrates are shown as FIGS. 3A (hydrogen plasma) and 3B (ammonia plasma). The substrate cleaned by the hydrogen plasma shows ruthenium deposits on the darker colored dielectric lines demonstrating relatively poor selectivity. In contrast, the substrate cleaned by the ammonia plasma does not show any ruthenium deposits on the dielectric lines thereby demonstrating superior selectivity.

Further, the substrate cleaned by the ammonia plasma demonstrated a superior deposition rate for the deposited ruthenium film. For the ammonia plasma cleaned substrate the deposition rate was 0.028 Å/s as compared to the hydrogen plasma cleaned substrate at only 0.018 Å/s.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of selective deposition, the method comprising:
exposing a substrate comprising a conductive material and a dielectric material to a silyl amine of the general formula $((CH_3)_2N)_xSi(CH_3)_y((CH_2)_zCH_3)$, where x is 1-3, y is 0-2, x+y equals 3, and z is 1-17 to selectively form a surfactant layer on the dielectric material; and
selectively depositing a film on the conductive material.

2. The method of claim 1, wherein the conductive material comprises one or more of copper, manganese, cobalt, tungsten, ruthenium, or molybdenum.

3. The method of claim 1, wherein the dielectric material comprises one or more of silicon oxide, or low-k dielectrics.

4. The method of claim 1, wherein z is less than or equal to 5.

5. The method of claim 1, wherein selectively depositing the film comprises a chemical vapor deposition process.

6. The method of claim 1, wherein the film comprises a metal film.

7. The method of claim 6, wherein the metal consists essentially of ruthenium.

8. The method of claim 7, wherein a cobalt cap is deposited on the film to form a Ru—Co capping layer.

9. The method of claim 1, wherein the surfactant layer is not removed after the film is selectively deposited.

10. The method of claim 1, wherein z is 5-10.

11. The method of claim 1, wherein z is 11-17.

12. The method of claim 11, wherein z is 11-14.

13. The method of claim 11, wherein z is 15-17.

* * * * *